(12) United States Patent
Shimotomai

(10) Patent No.: US 6,481,482 B1
(45) Date of Patent: Nov. 19, 2002

(54) LAMINATING APPARATUS FOR MANUFACTURING PHOTOVOLTAIC MODULE

(75) Inventor: Mitsuhiro Shimotomai, Aichi (JP)

(73) Assignee: Nisshinbo Industries, Inc., Tokyo (JP)

( * ) Notice: Subject to any disclaimer, the term of this patent is extended or adjusted under 35 U.S.C. 154(b) by 0 days.

(21) Appl. No.: 09/397,023

(22) Filed: Sep. 16, 1999

(30) Foreign Application Priority Data

Sep. 24, 1998 (JP) .......................................... 10-285866

(51) Int. Cl.[7] .............................................. B32B 31/00
(52) U.S. Cl. ..................... 156/366; 156/382; 156/583.1; 156/583.3; 100/322; 100/326
(58) Field of Search ................................ 156/285, 286, 156/366, 359, 382, 583.3, 583.1; 100/326, 322

(56) References Cited

U.S. PATENT DOCUMENTS

| | | | | |
|---|---|---|---|---|
| 3,580,795 A | * | 5/1971 | Eichenlaub | 156/285 |
| 3,738,890 A | * | 6/1973 | Johnson et al. | 100/326 |
| 3,950,210 A | * | 4/1976 | Gibbs et al. | 156/583 |
| 3,964,958 A | * | 6/1976 | Johnston | 156/285 |
| 4,067,764 A | * | 1/1978 | Walker et al. | 156/286 |
| 4,445,025 A | * | 4/1984 | Metz | 156/499 |
| 5,069,120 A | * | 12/1991 | Schneider | 100/323 |
| 5,126,000 A | * | 6/1992 | Takai et al. | 156/285 |
| 5,578,158 A | * | 11/1996 | Gutowski et al. | 156/285 |
| 5,593,532 A | * | 1/1997 | Falk et al. | 156/285 |

FOREIGN PATENT DOCUMENTS

| | | | |
|---|---|---|---|
| JP | 9-141743 A | * | 6/1997 |
| WO | WO 87/01651 A1 | * | 3/1987 |

* cited by examiner

*Primary Examiner*—Jeff H. Aftergut
(74) *Attorney, Agent, or Firm*—Duane Morris LLP

(57) ABSTRACT

The present invention provides a laminating method and a laminating apparatus for a manufacture of photovoltaic modules capable of preventing or suppressing an occurrence of warp or cracks in a multilayer material to be processed and capable of improving the productivity, by minimizing a temperature difference between an upper surface and a lower surface of the multilayer material. In a method of laminating photovoltaic modules configured by a surfacing member 1, a filler 2, photovoltaic modules 3, another filler 5 and a backing member 6, the surfacing member 1 and the backing member 6 are heated from the outside to melt the fillers 2 and 5, for lamination.

13 Claims, 9 Drawing Sheets

LAMINATING APPARATUS FOR MANUFACTURING PHOTOVOLTAIC MODULE

BACKGROUND OF THE INVENTION

1. Field of the Invention

The present invention relates to a laminating method and a laminating apparatus for manufacturing a photovoltaic module.

2. Description of Related Art

As a laminating apparatus for manufacturing a photovoltaic module, there has been a one disclosed in Japanese Patent Application Laid-open Publication No. 9-141743 or a one disclosed in Japanese Utility Model Publication No. 3037201. A conventional laminating apparatus is generally configured by a lid having an upper chamber formed with a diaphragm expandable downwardly and a vacuum vessel main body corresponding to the lid having a lower chamber equipped with a heating plate. In a state that the lid is opened, there is mounted a multilayer material to be processed on the heating plate provided in the lower chamber of the main body. The multilayer material is configured by a sequential stacking of a glass plate as a lowermost layer, a sheet-like filler, photovoltaic modules and another sheet-like filler, with a sheet-like backing member mounted as an uppermost layer. Then, the upper chamber and the lower chamber are pressure-reduced and the multilayer material is heated. The air or the atmosphere is introduced into the upper chamber so that the multilayer material is sandwiched between an upper surface of the heating plate and the diaphragm to be laminated with pressure.

In the above, the pressure-reduction, namely evacuation, is conducted in the upper chamber and the lower chamber in order to prevent air void from remaining in the multilayer material. The reduction is because, when the photovoltaic module including the remaining air void is exposed to sunlight and its temperature rises, the air void are expanded to accelerate degradation of the photovoltaic module.

Also, the multilayer material is heated by the heating plate while the temperature of the heating plate is being controlled to a set temperature. After a lapse of an appropriate time period, the temperature of the multilayer material becomes approximately equal to the temperature of the heating plate. Therefore, when the set temperature is a temperature above the melting point of the filler, the filler melts, and the air is introduced into only the upper chamber so that the diaphragm is inflated to press the multilayer material against the heating plate to laminate the multilayer material with the heating plate into one unit. After this laminating, the lower chamber is restored to the atmospheric pressure, and the lid is opened to take out the multilayer material.

On the other hand, EVA (ethylene-vinyl-acetate) resin is used as a filler. When the EVA resin is used, it melts at about 80° C. to 110° C. Therefore, in the laminating apparatus, the resin is melted at the above temperature range or above and it is laminated by pressing.

However, according to the above-described conventional laminating apparatus, in manufacturing a photovoltaic module of a relatively large size of 1 square meters, for example, the temperature of the lower surface of the multilayer material in contact with the heating plate rises easily but the temperature of the upper surface does not rise so easily as that of the lower surface. Therefore, there arises a difference in temperatures between the upper surface and the lower surface. Because of this temperature difference, such a phenomenon arises that both ends of a multilayer material A are warped upwards as compared with the center portion, as shown in FIG. 9. Once this warp occurs, the end portion of the warp is separated from the heating plate 11, so that the temperature does not rise easily. Accordingly, it takes a long time to raise the temperature of the multilayer material A as a whole to a uniform temperature, resulting in poor productivity.

When the air is introduced into the upper chamber and the multilayer material is pressed with the diaphragm, the warped multilayer material A is pressed against the heating plate 11 and the temperature of the end portion is made to rise easily. However, with this arrangement, the multilayer material is pressed before the EVA is sufficiently melted, which has a risk of a frequent occurrence of a phenomenon that the photovoltaic modules are broken. In FIG. 9, a reference numeral 7 denotes a vacuum vessel main body, a reference numeral 12 denotes a lower chamber, and a reference numeral 13 denotes a sealing member for sealing a lid (not shown) provided on the vessel main body 7 from the above.

On the other hand, when the photovoltaic modules are made much larger, it becomes necessary to make larger the thickness of the glass plate of the lowermost layer for securing the strength. However, when the glass plate has a large thickness, the temperature difference between the upper surface and the lower surface of the multilayer material becomes much larger, and this has a risk of a breaking of the glass plate.

SUMMARY OF THE INVENTION

In view of the above conventional technique, an object of the present invention is to provide a laminating method and a laminating apparatus for manufacturing large-type photovoltaic modules in satisfactory productivity with minimum occurrence of warp of a multilayer material, by making smaller the temperature difference between an upper surface and a lower surface of the multilayer material.

A laminating method in the manufacture of photovoltaic modules according to the invention which aims at solving the above problems is characterized in that, in a manufacture of photovoltaic modules configured by a surfacing member, a filler, photovoltaic modules, another filler and a backing member, the surfacing member and the backing member are heated from the outside to melt the fillers. Further, a laminating apparatus for implementing this method is a laminating apparatus having an upper chamber and a lower chamber partitioned by a diaphragm, wherein a heating plate incorporating a heater is disposed within the lower chamber and one or a plurality of flexible heaters are disposed between the lower chamber and the diaphragm.

In other words, according to the laminating method of the invention, a multilayer material configured by a surfacing member, a filler, photovoltaic modules, another filler and a backing member is heated from both the front surface and the back surface to melt the fillers so that these members are laminated. This avoids an occurrence of warp and provides a satisfactory heat conduction. Productivity is improved by this arrangement. When a glass plate is used as a surfacing member, its internal stress can be decreased to prevent an occurrence of cracking.

Further, according to the laminating method of the invention, in the case of laminating by a laminating apparatus having an upper chamber and a lower chamber partitioned by a diaphragm, a multilayer material to be processed is set within the lower chamber, followed by an evacuation of the lower chamber, and a gas is introduced into the upper chamber for pressing. At first, the pressing is conducted at a low pressure, and thereafter, the pressing is conducted at a high pressure. This causes the photovoltaic modules to be pressed against the heating plate without generating a crack in the photovoltaic modules, and also promotes a uniform distribution of the temperature of the multilayer material. After the temperature is raised uniformly, the pressing is conducted at a high pressure, and thus the lamination is completed.

A laminating apparatus for implementing the above laminating method has a heating plate incorporating a heater within the lower chamber, and also has at least one flexible heater between the lower chamber and the diaphragm. This is because it is preferable that the heaters are deformed along the multilayer material when the multilayer material is pressed.

Further, in the case of providing flexible heaters, it is possible to obtain a satisfactory uniform distribution of temperatures within the range of pressing when a large number of flexible heaters are divided into a plurality of groups and temperature is controlled for each group. Further, when the plurality of flexible heaters are provided such that each individual heater can be taken out, it becomes possible to replace only a heater which has a problem of a dislaminateion or the like. This can minimize a loss.

In the above-described laminating apparatus, there may be disposed a sheet-like heating unit between the lower chamber and the diaphragm. This sheet-like heating unit is provided by sandwiching a conductor with rubber sheets to form a heater, then laminateing this heater with a flexibly bendable and not-easily stretchable sheet, and by laminateing this sheet with a stretchable elastic sheet. By laminateing the heater with the flexibly bendable and not-easily stretchable sheet, this sheet prevents the heater from being stretched when the heater is deformed along the multilayer material by a pressing. Thus, the life of the heater is made longer until it is dislaminated. However, when the length of this sheet-like heating unit is in short although it can lie along the multilayer material, the heating unit cannot keep a close adhesion to the multilayer material. This can be solved when a stretchable elastic sheet is laminated to both ends of the sheet. A flexibly bendable and not-easily stretchable sheet includes a rubber sheet having a glass fiber as a core material. A stretchable and elastic sheet includes a silicone rubber sheet, or the like.

Then, in the heating plate incorporating a heater within the lower chamber and the at least one flexible heater disposed between the lower chamber and the diaphragm, a temperature control is carried out by not conducting a current to the other when a current is conducted to the one. With this arrangement, a maximum current conducted does not become large despite a fact that a heating is applied from both the lower and upper surfaces. Thus, a large power supply facility is not necessary.

As another laminating apparatus for implementing the laminating method of the invention, there may be provided such a configuration that a heating plate incorporating a heater is provided within a lower chamber and a heater is provided within an upper chamber. It is possible to conduct heat to the diaphragm by a radiant heating from the heater inside the upper chamber and a heat conduction of the gas, thereby to heat a multilayer material through the diaphragm.

Further, as another laminating apparatus for implementing the laminating method of the invention, there may be provided such a configuration that a heating plate incorporating a heater is provided within a lower chamber and a heater for heating the gas and a blower for circulating the heated gas are provided within an upper chamber. With this arrangement, the gas heated within the upper chamber is circulated forcibly to conduct heat to a diaphragm for heating a multilayer material.

As a laminating apparatus for implementing the laminating method by using a laminating apparatus having the upper chamber and the lower chamber partitioned by the diaphragm, with the lower chamber evacuated and a gas introduced into the upper chamber, for pressing at a low pressure at the beginning and thereafter pressing at a high pressure to carry out a lamination, there may be provided a plurality of pressure setters so as to be able to change the pressure within the upper chamber. According to this laminating apparatus, it is possible to operate as follows, as an example. A low pressure is set to one pressure setter and a high pressure is set to the other pressure setter. In the case of pressing at a low pressure, the gas is introduced into the upper chamber until when the pressure setter set with the low pressure operates. At a point of time when the pressure setter set with the low pressure operates, the introduction of the gas is stopped and the pressure is maintained. Thereafter, for pressing at a high pressure, the gas is introduced into the upper chamber again. At a point of time when the setter set with the high pressure operates, the introduction of the gas is stopped and the pressure can be maintained. When the introduction of the gas is stopped and the pressure is maintained for a relatively long time, the gas inside the upper chamber inflates by the heat and the inside pressure increases. In this case, at a point of time when it is detected that the inside pressure is higher than the set pressure, the vacuum valve is opened momentarily to return the pressure to the set pressure, thereby to maintain the pressure at a constant level, for example.

As a laminating apparatus for implementing the laminating method by using a laminating apparatus having the upper chamber and the lower chamber partitioned by the diaphragm, with the lower chamber evacuated and a gas introduced into the upper chamber, for pressing at a low pressure at the beginning and thereafter pressing at a high pressure to carry out a lamination, there may be provided a plurality of timers for setting a time for introducing the gas into the upper chamber. In other words, when this laminating apparatus is used, the gas is introduced to carry out a pressing at a low pressure until when one timer starts operating. After maintaining the pressure for a suitable period of time, the gas is introduced again. The introduction of the gas is stopped at a point of time when the other timer starts operating, so that a high-pressure pressing can be carried out.

DETAILED DESCRIPTION OF THE PREFERRED EMBODIMENTS

Figure 1:
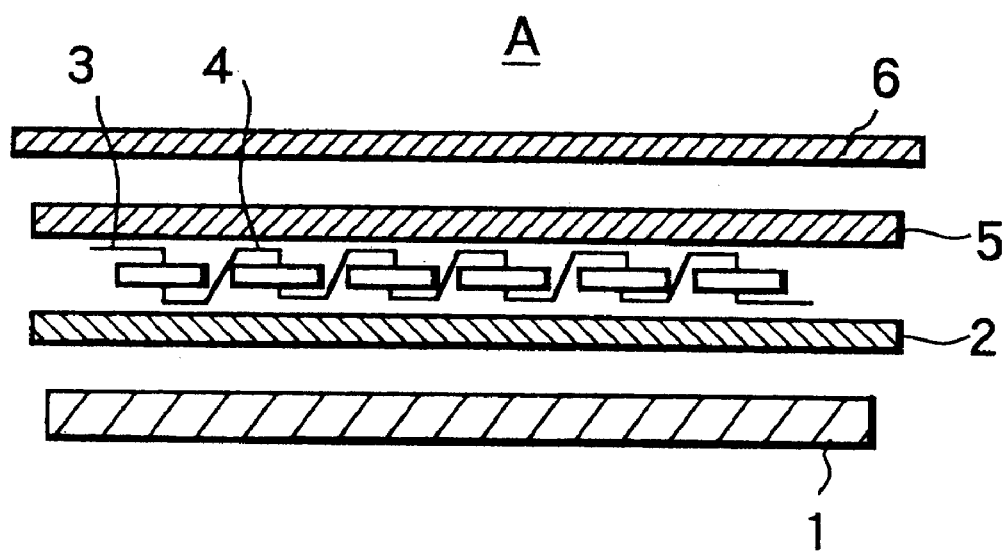
FIG. 1 is a sectional view for showing a multilayer material to be processed.
Figure 2:
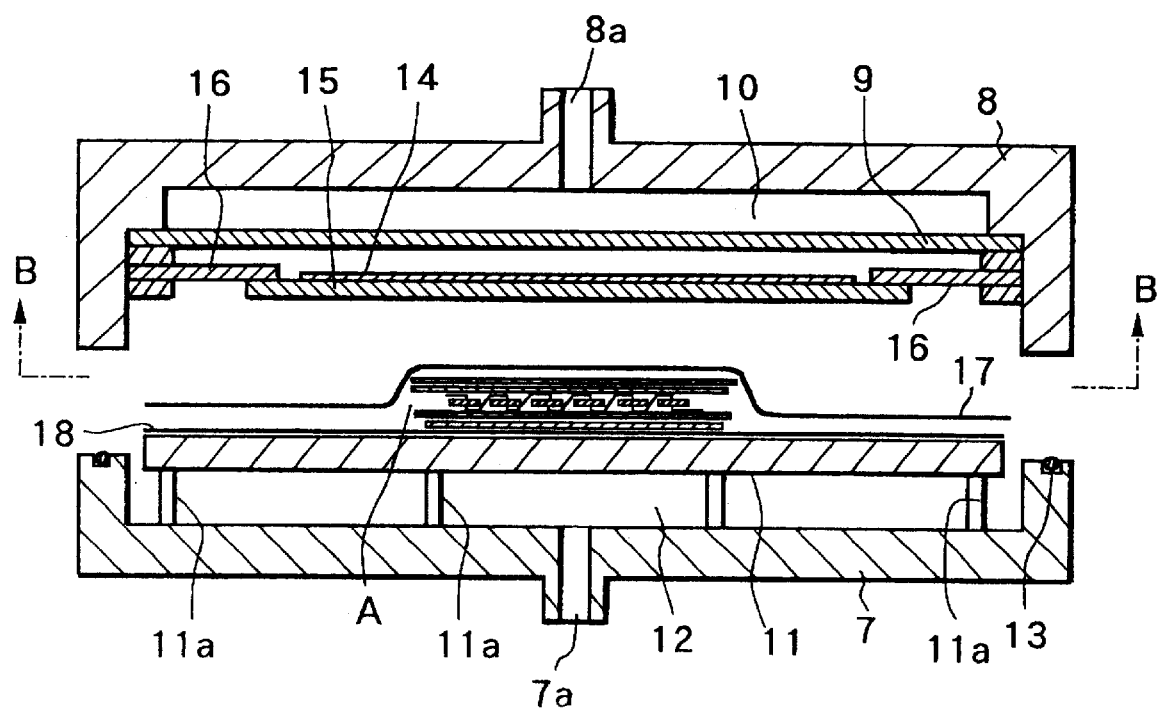
FIG. 2 is a sectional view for showing a state that a lid of a laminating apparatus as one example of the present invention is opened.
Figure 3:
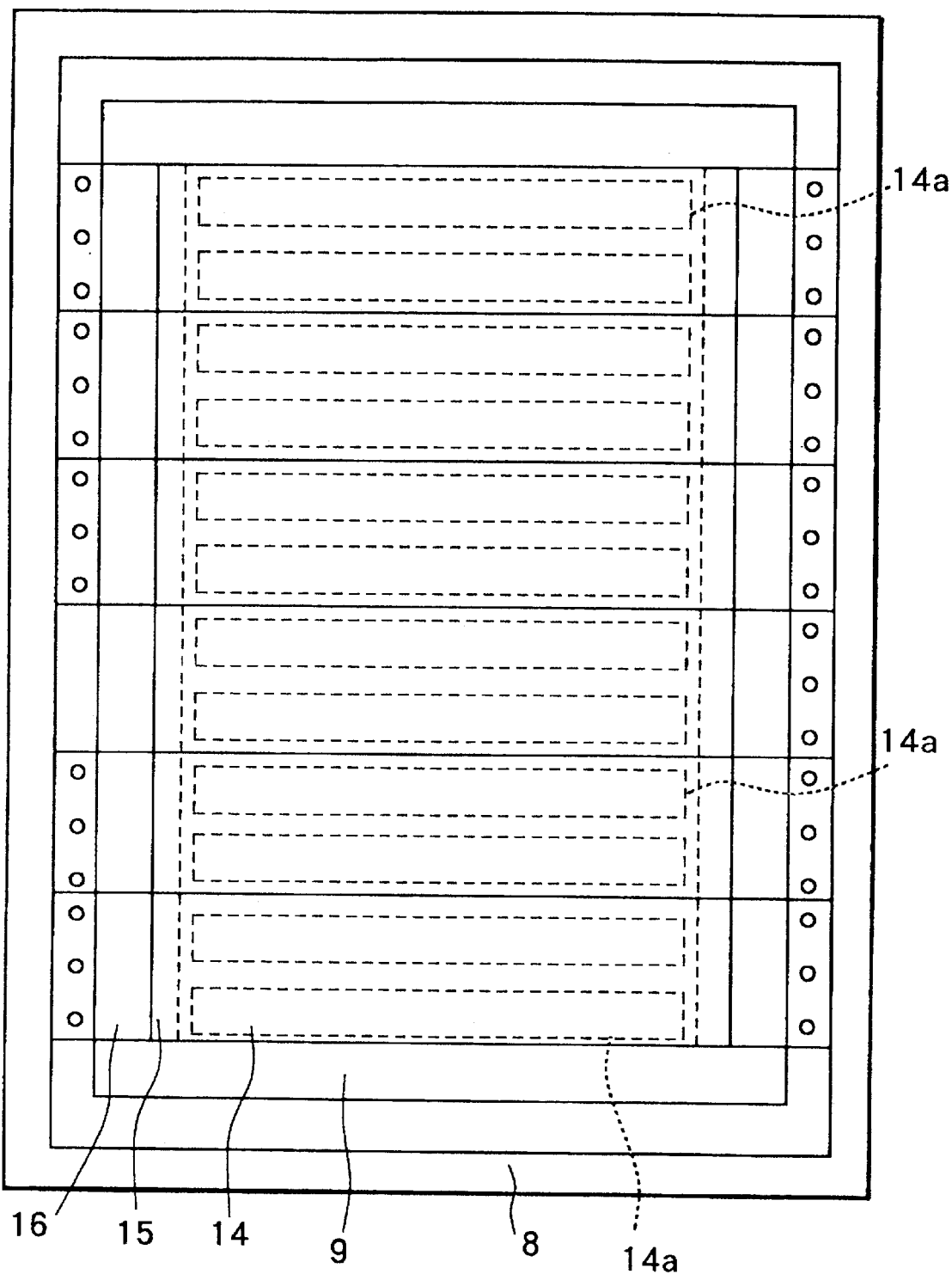
FIG. 3 is a view cut along B—B line of FIG. 2.
Figure 4:
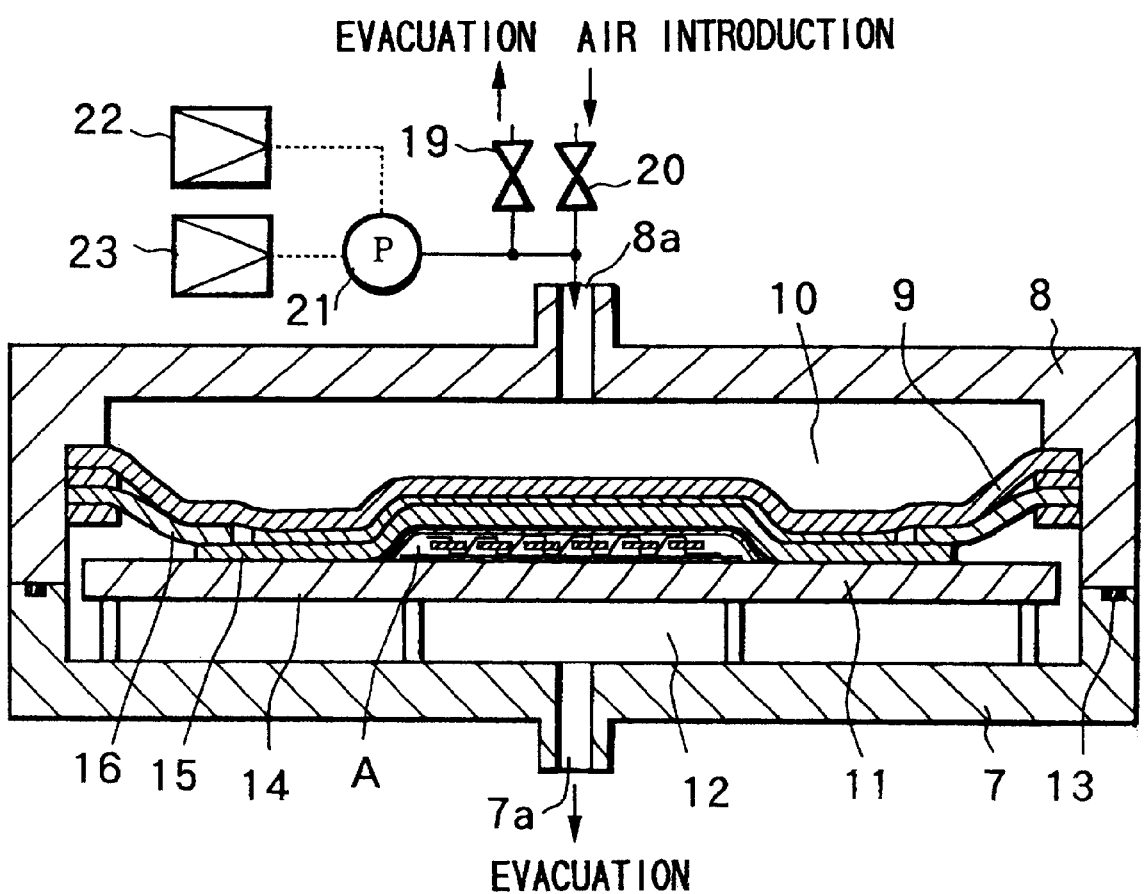
FIG. 4 is a sectional view for showing a state that a laminating processing is carried out with a lid of the laminating apparatus in FIG. 2 closed.
Figure 5:
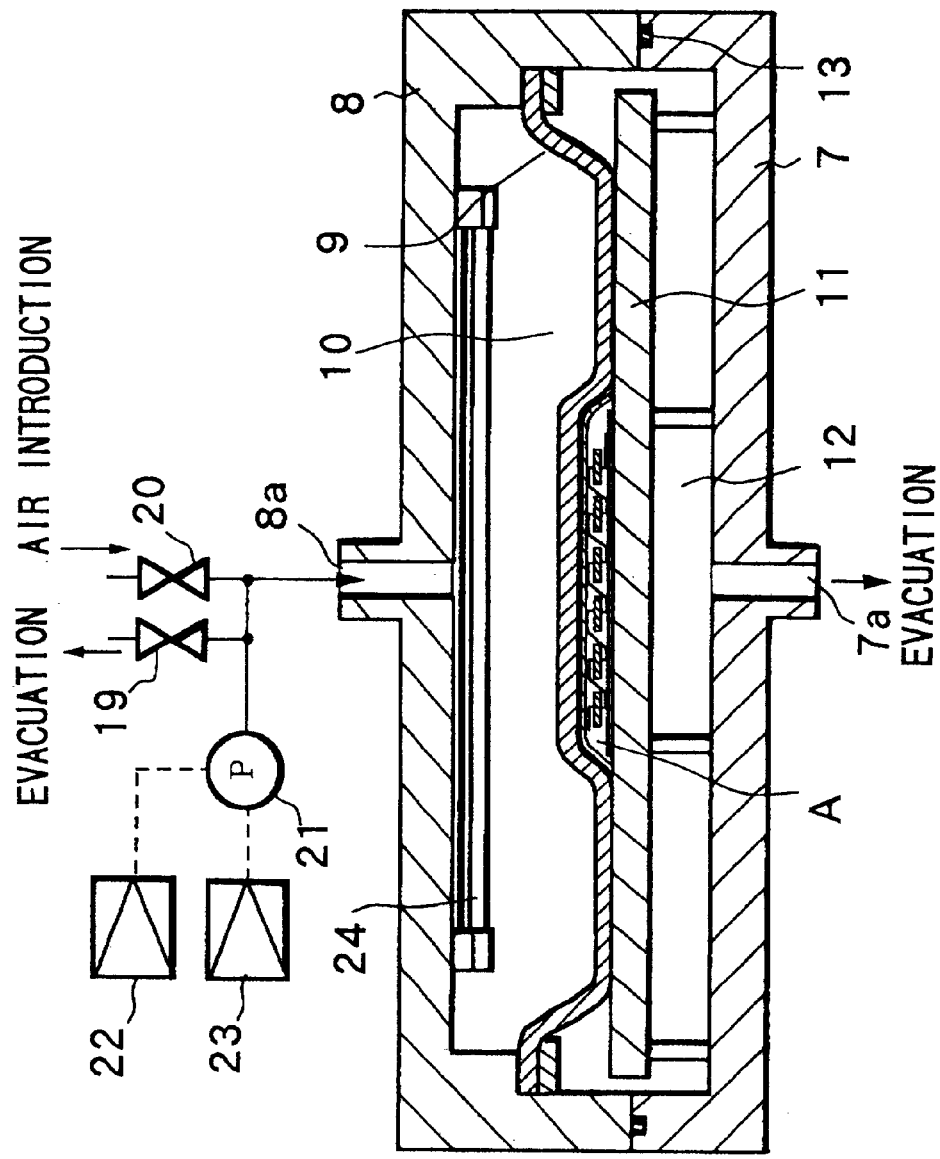
FIG. 5 is a sectional view for showing another example of a laminating apparatus of the present invention.
Figure 6:
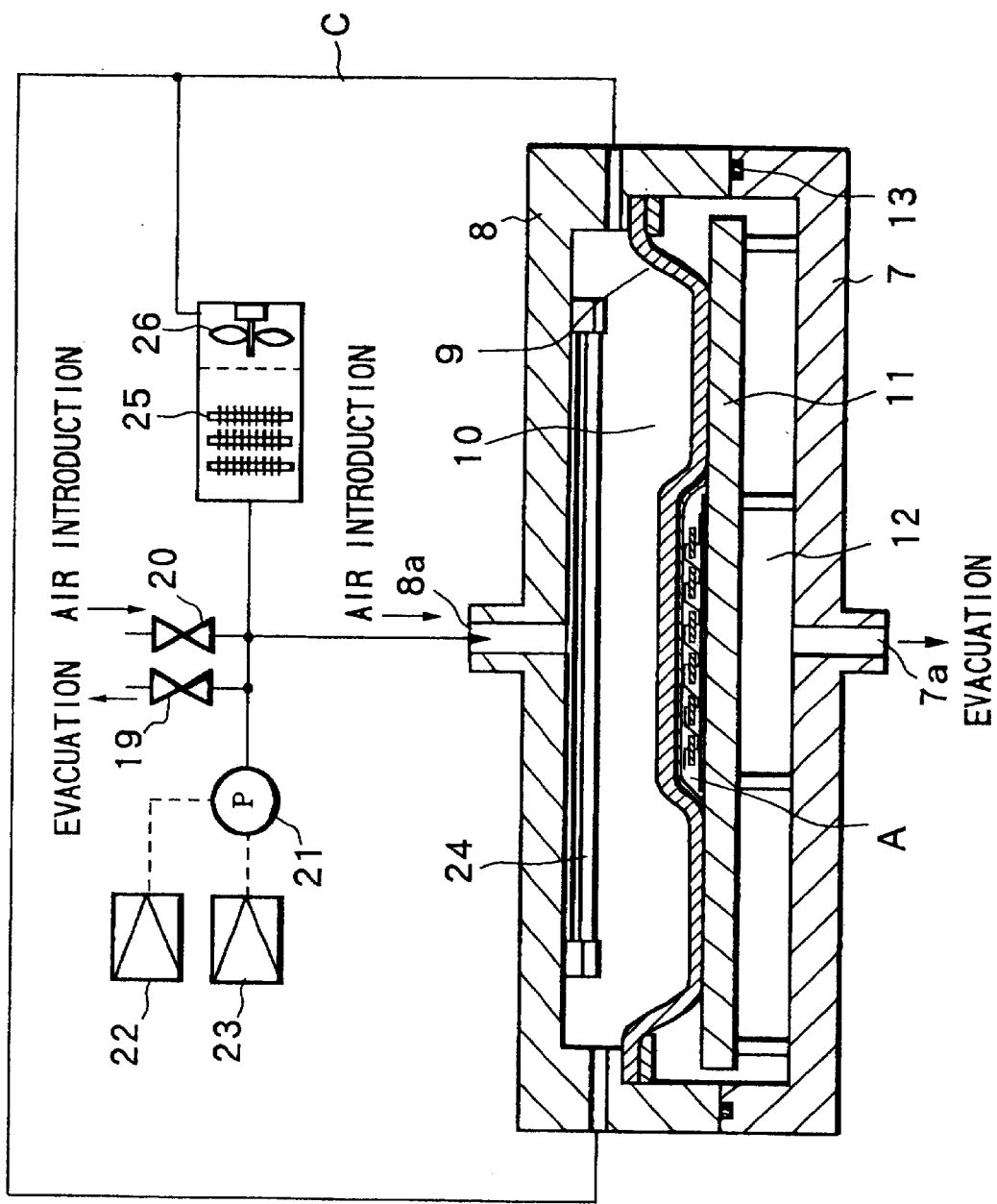
FIG. 6 is a sectional view for showing still another example of a laminating apparatus of the present invention.
Figure 7:
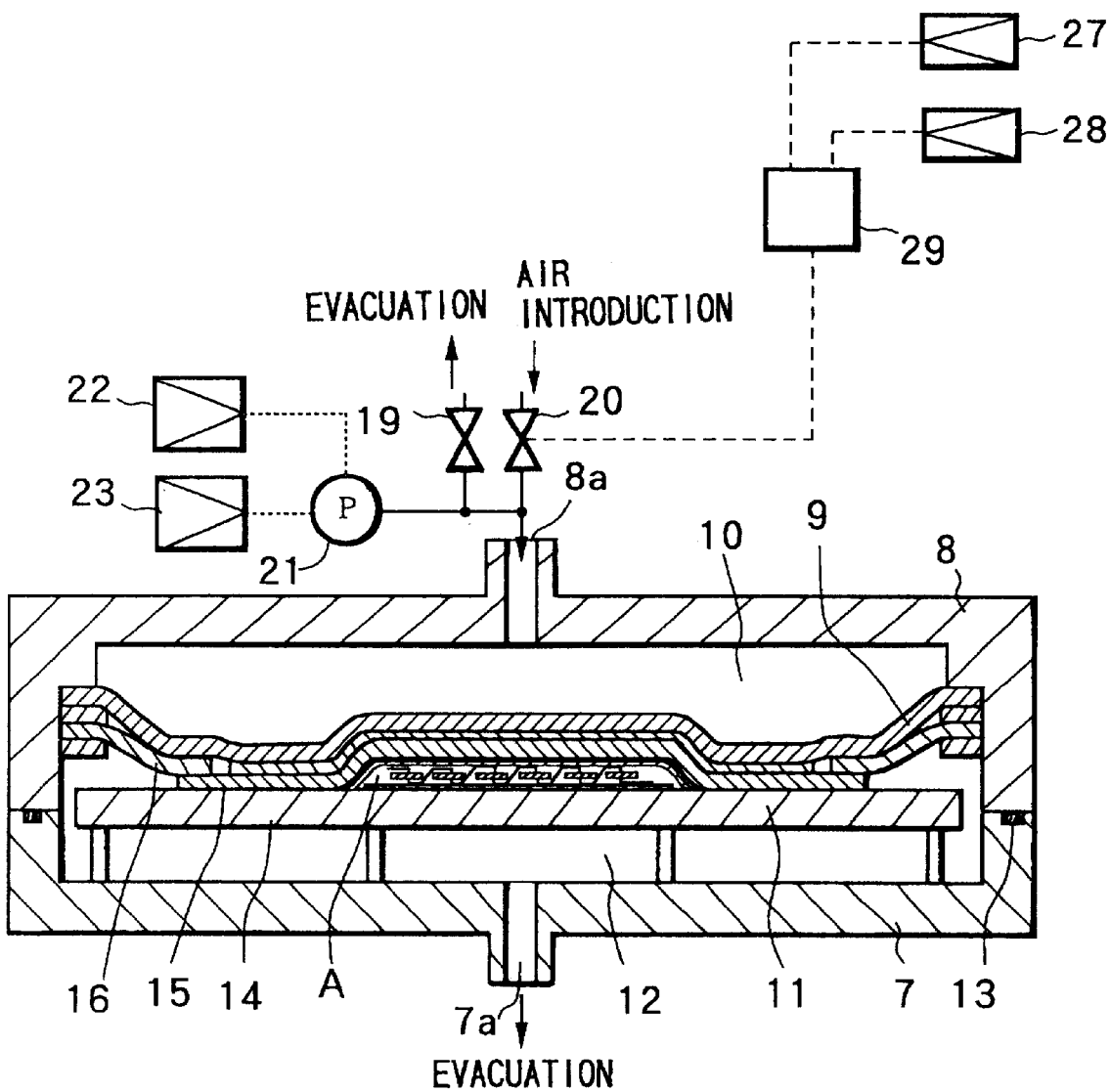
FIG. 7 is a sectional view for showing still another example of a laminating apparatus of the present invention.
Figure 8:
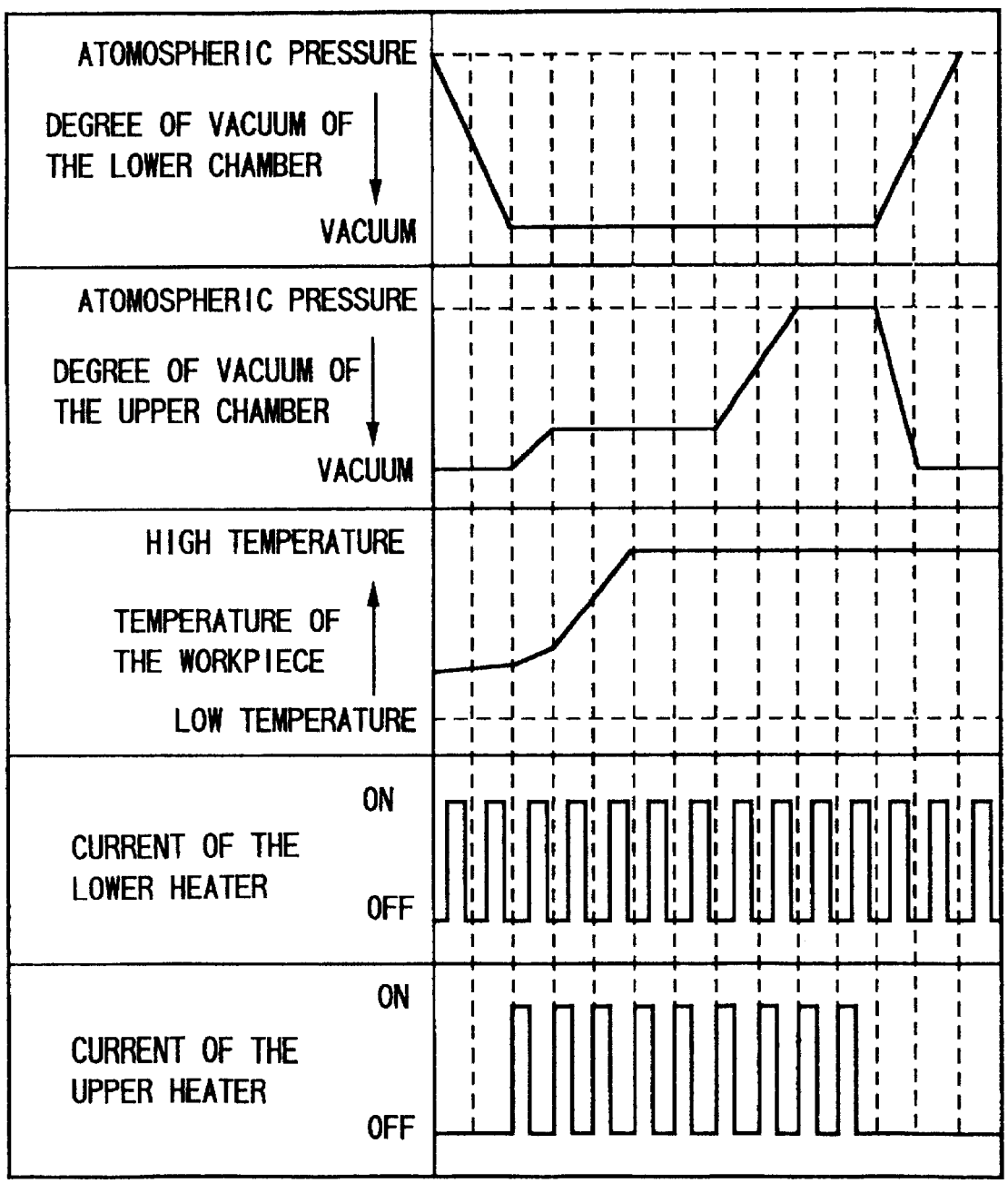
FIG. 8 is a line diagram for showing a laminating processing cycle of a laminating apparatus according to the present invention.
Figure 9:
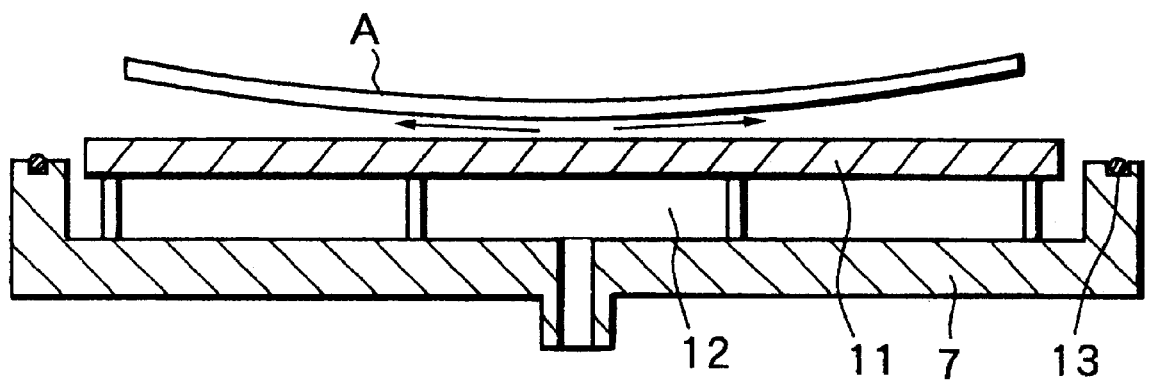
FIG. 9 is a sectional view for showing a warp of a multilayer material to be processed when the multilayer material is positioned on a heating plate in a conventional laminating apparatus.

Embodiments of the present invention will be explained with reference to the drawings. FIG. 1 is a sectional view for showing a multilayer material to be processed; FIG. 2 is a sectional view for showing a state that a lid of a laminating apparatus as one example of the present invention is opened; FIG. 3 is a view cut along B—B line of FIG. 2; FIG. 4 is a sectional view for showing a state that a laminating processing is carried out with the lid of the laminating apparatus in FIG. 2 closed; FIG. 5 is a sectional view for showing another example of a laminating apparatus of the present invention; FIG. 6 is a sectional view for showing still another example of a laminating apparatus of the present invention; FIG. 7 is a sectional view for showing still another example of a laminating apparatus of the present invention; FIG. 8 is a line diagram for showing a laminating processing cycle of a laminating apparatus according to the present invention; and FIG. 9 is a sectional view for showing a warp of a multilayer material to be processed when the multilayer material is positioned on a heating plate in a conventional laminating apparatus.

In FIG. 1, a reference character A denotes a multilayer material to be laminated and the multilayer material is configured such that a sheet-like filler 2, photovoltaic modules 3 and another sheet-like filler 5 are sequentially stacked on a lowermost glass plate 1 and a backing member 6 is disposed at an uppermost position. A reference numeral 4 denotes a ribbon-like electrode laminateing the photovoltaic modules 3.

In FIG. 2, a reference numeral 7 denotes a vacuum vessel main body, a reference numeral 8 denotes a lid of the vacuum vessel 7, a reference numeral 9 denotes a diaphragm fitted to the inside of the lid 8, a reference numeral 10 denotes an upper chamber formed between a lower surface of the inside of the lid 8 and an upper surface of the diaphragm 9, a reference numeral 11 denotes a heating plate incorporating a heater fitted to the vacuum vessel 7, reference numerals 11a denote supporting members of the heating plate 11, and a reference numeral 12 denotes a lower chamber formed between an upper surface of the inside of the vacuum vessel main body 7 and a lower surface of the diaphragm 9. The vacuum vessel main body 7 can be put in an airtight situation by closing the lid 8 through a sealing member 13 provided on the periphery of the vacuum vessel main body to be brought into contact with the lid. A reference numeral 7a denotes a gas pipe laminateing port of the vacuum vessel main body 7, a reference numeral 8a denotes a gas pipe laminateing port of the lid 8, and both the laminateing ports 7a and 8a are for evacuation of the chamber and introduction of the air into the chamber. A conventional laminating apparatus is configured with the above elements. However, according to the laminating apparatus of the present invention, an upper heater 14 is disposed below the diaphragm 9. This upper heater 14 is a flexible material configured by sandwiching a conductor between rubber sheets. This upper heater 14 is installed on a sheet 15 having flexibly bendable and not-easily stretchable characteristics. Both ends of the sheet 15 are laminated to stretchable elastic sheets 16 having one end thereof fixed to the inside of the lid 8.

The upper heater 14 is disposed on a plane inside the lid 8 as shown in FIG. 3. The upper heater 14 is structured by installing a plurality of band-like heating units 14a. When a dislaminateion or the like occurs in one of the heating units 14a, only this portion can be replaced. Thus, a loss is small. In the example shown in FIG. 3, the heating units 14a are installed by six sets. When these heating units are grouped into three, each having two sets, it is easy to achieve a uniform temperature control. The number of the heating units 14a of the upper heater 14 and their grouping are not limited to the above. As the sheet 15 for installing the upper heater 14, a silicone rubber sheet having a fiberglass sheet as a core material is used, for example. As the stretchable elastic sheet 16 to be laminated to the sheet 15, a silicone rubber sheet can be used, for example.

In FIG. 2, reference numerals 17 and 18 denote release sheets for preventing the fillers 2 and 5 from overflowing and adhering to the glass plate 1 or the like when they are melted at the time of laminating the multilayer material A. The release sheet 17 is disposed on the upper surface of the multilayer material A, and the release sheet 18 is disposed on the lower surface of the multilayer material A.

As shown in FIG. 4, the multilayer material A is placed on the heating plate 11, and the vacuum vessel 7 is closed by the lid 8. Then, the vacuum vessel 7 is evacuated and the multilayer material A is heated from both upper and lower sides by the upper heater 14 and the heating plate 11 respectively. The multilayer material A is pressed from the above by the diaphragm 9 against the heating plate 11. Then, the upper heater 14 is pressured against the backing member 6 and the heating plate 11 is pressured against the glass plate 1. The fillers 2 and 5 are melted by the heating of the upper heater 14 and the heating plate 11, and the multilayer material A is degassed so that the multilayer material is formed in a laminated body. After the laminated body is formed, the lid 8 is removed and the multilayer material A is taken out.

In the above laminating processing, the upper heater 14 is fitted to the flexibly bendable and not-easily stretchable sheet 15, and the sheet 15 is laminated to the stretchable elastic sheets 16 fixed to the inside of the lid 8. Therefore, the elastic sheets 16 stretch according to a pressing pressure of the diaphragm 9 to compensate for a not-stretching portion of the sheet 15. Further, during the same laminating processing, even if the fillers 2 and 5 overflow in a melted state by the heating, the release sheets 17 and 18 receive this overflowing, so that the overflowed fillers 2 and 5 do not adhere to the heating plate 11 and the sheet 15. In FIG. 4, a reference numeral 19 denotes a vacuum valve provided in the piping laminated to the laminateion port 8a, a reference numeral 20 denotes a valve for introducing the air, a reference numeral 21 denotes a pressure detector for detecting a pressing pressure, and reference numerals 22 and 23 denote pressure setters. It is assumed that a high pressure is pre-set to the setter 22 and a low pressure is pre-set to the other setter 23.

A laminating apparatus shown in FIG. 5 has such a configuration that an upper heater 24 is installed on the back surface of the lid 8, that is, inside an upper chamber 10, and heat is conducted to a multilayer material A through a diaphragm 9. Heat is conducted from the upper heater 11 to the diaphragm 9 by a radiant heating from the heater and a heat conduction of the gas inside the chamber 10, thereby to uniformly heat the multilayer material A.

A laminating apparatus shown in FIG. 6 is the laminating apparatus shown in FIG. 5 added with the following function. An upper heater 25 and a blower 26 are provided outside the lid 8, that is, outside the upper chamber 10, and the blower 26 is laminated to the inside of the upper chamber 10 by a piping C. After a pressing, the gas inside the upper chamber 10 is heated by the upper heater 25. The heated gas is forcibly circulated by the blower 26 to raise the temperature of the gas inside the upper chamber 10, thereby to heat the diaphragm 9. Then, the multilayer material A is heated through the diaphragm 9. In this example, as the upper heater 24 is also installed inside the chamber 10, it is possible to heat the multilayer material A from the upper surface by both of the heaters 24 and 25.

A laminating apparatus shown in FIG. 7 is the laminating apparatus shown in FIG. 2 which is additionally provided with a plurality of timers for controlling the open and close operation of a control unit 29 in order to control the time during which a valve 20 for introducing the air into the upper chamber 10 is open. During a period of time set by a timer 27, the valve 20 is kept opened by the control unit 29 to give a pressing at a low pressure. Then, the valve is closed, and after a lapse of a suitable period of time, the valve 20 is opened again. After a lapse of period of time set by a timer 28, the valve 20 is closed and a pressing is applied at a high pressure. Thus, it is possible to achieve a suitable laminating processing.

FIG. 8 is a line diagram for showing an example of a laminating processing cycle in the laminating apparatus shown in FIG. 4. Before applying a pressing, the upper chamber 10 is also evacuated as well as the lower chamber 12. In this state, the valve 20 for introducing the air is opened to introduce the air into the upper chamber 10. At a point of time when the pressure setter 23 operates, the pressure detector 21 closes the valve 20, so that a pressing can be applied at a low pressure. Preferably, this pressure is set at a level not to break the photovoltaic modules 3. When the warp of the multilayer material A becomes small and as the multilayer material is kept being pressed, heat conduction becomes satisfactory.

After a lapse of a suitable period of time since the multilayer material is pressed at a low pressure, the photovoltaic modules, i.e. the module is heated at a constant temperature at which the fillers 2 and 5 are melted. Thereafter, the gas is introduced again and a pressing is applied at a high pressure until the pressure setter 22 starts operating.

The temperatures of the upper heater 14 and the heating plate 11 as the lower heater are controlled according to a ratio of a time while a current is flowing to a time while a current is not flowing. When a target temperature is reached, the ratio of the time while a current is conducted to the heaters to the time while a current is not conducted becomes small. This is because a current is required by only a portion to compensate for the heat quantity of heat radiated from the heaters and the heat quantity of heat conducted to the multilayer material A. In the present invention, it is so controlled that while a current is being conducted to one of the heating plate 11 and the upper heater 14, a current is not conducted to the other. With this arrangement, current is not conducted to both heaters 11 and 14 at the same time. Therefore, a maximum current required for the apparatus can be made smaller. As a result, the laminating apparatus of the invention does not require a large power supply unit.

While the laminating processing cycle has been explained above by taking an example of the laminating apparatus shown in FIG. 4, it is needless to mention that this processing cycle can also be applied to the rest of the laminating apparatuses described above.

As explained above, according to the invention, a multilayer material to be processed is heated from the upper and lower surfaces of the multilayer material in laminating photovoltaic modules. Therefore, it is possible to suppress an occurrence of warp and cracks in the multilayer material, particularly the photovoltaic modules, as compared with the case of heating from only the lower surface. Moreover, it is possible to reduce time required for raising the temperature of the multilayer material to a predetermined temperature level, thereby improving the productivity.

Further, when the multilayer material has a large size, the upper heater or the diaphragm is contacted to the multilayer material for heating the multilayer material from the upper surface. In this case, as the cells are easily broken when the multilayer material is pressed suddenly at a high pressure, a pressing is applied at first at a low pressure to prevent the cells from being cracked. Then, the upper heater or the diaphragm is brought into contact with the multilayer material, and a pressing is applied at a high pressure at a point of time when the fillers are melted, thereby to laminate the multilayer material. In this way, the multilayer material can be heated from the above while preventing an occurrence of cracks. Therefore, the present invention is suitable for improving the productivity of a multilayer material of particularly a large size.

What is claimed is:

1. A laminating apparatus for laminating a multilayer material, the apparatus having a main body and a lid forming an upper chamber and a lower chamber partitioned by a diaphragm, comprising:

a heating plate disposed within the lower chamber;

a flexible heater disposed below the diaphragm within the lower chamber; and means for deflecting the diaphragm to urge said flexible heater towards the multilayer material placed between said heating plate and said flexible heater, said means for deflecting causing said flexible heater to come in contact with the multilayer material.

2. A laminating apparatus according to claim 1, wherein said flexible heater includes a plurality of heating units and the plurality of heating units are divided into a plurality of groups and temperature is controlled for each group.

3. A laminating apparatus according to claim 1, wherein said plurality of heating units are provided such that each individual heating unit can be taken out.

4. A laminating apparatus according to claim 1, wherein, said heating plate and said flexible heater are controlled so that while a current is being conducted to one of the said heating plate or said flexible heater, a current is not conducted to the other.

5. The apparatus of claim 1 wherein the means for deflecting includes a plurality of pressure setters for making the pressure within the upper chamber variable.

6. The apparatus of claim 1 wherein the means for deflecting includes a plurality of timers for setting a time for introducing a gas into the upper chamber.

7. A laminating apparatus having an upper chamber and a lower chamber partitioned by a diaphragm, wherein a heating plate incorporating a heater is disposed within the lower chamber and one or more flexible heaters are disposed between the lower chamber and the diaphragm, wherein there is disposed a heating unit between the lower chamber and the diaphragm, the heating unit being provided by sandwiching a conductor with rubber sheets to form a heater, then laminating the heater with a flexibly bendable and not-easily stretchable sheet, and by laminating the sheet with a stretchable elastic sheet.

8. A laminating apparatus for laminating a multilayer material, the apparatus having a main body and a lid forming an upper chamber and a lower chamber partitioned by a diaphragm, comprising:

a heating plate incorporating a heater disposed within the lower chamber;

a flexible heater disposed below the diaphragm within the lower chamber, wherein said flexible heater includes a plurality of heating units laminated to a flexible not-easily stretchable sheet and the flexible not-easily stretchable sheet is attached to the lid by a stretchable sheet portion to thereby allow the flexible heaters to come in contact with the multilayer material without stretching the heaters; and means for pressurizing the upper chamber to thereby deflect the diaphragm and cause said flexible heater to contact the multilayer material.

9. A laminating apparatus according to claim 8, wherein the plurality of heating units are divided into a plurality of groups and temperature is controlled for each group.

10. A laminating apparatus according to claim 8, wherein the plurality of heating units are provided such that each individual heating unit can be taken out.

11. A laminating apparatus according to claim 8, wherein, said heating plate and said flexible heater are controlled so that while a current is being conducted to one of the said heating plate or said flexible heater, a current is not conducted to the other.

12. The apparatus of claim 8 wherein the means for pressurizing includes a plurality of pressure setters for making the pressure within the upper chamber variable.

13. The apparatus of claim 8 wherein the means for pressurizing includes a plurality of timers for setting a time for introducing a gas into the upper chamber.

* * * * *